United States Patent
Suzuki et al.

(10) Patent No.: US 6,548,342 B1
(45) Date of Patent: Apr. 15, 2003

(54) METHOD OF PRODUCING OXIDE DIELECTRIC ELEMENT, AND MEMORY AND SEMICONDUCTOR DEVICE USING THE ELEMENT

(75) Inventors: Takaaki Suzuki, Hitachinaka (JP); Toshihide Nabatame, Hitachi (JP); Kazutoshi Higashiyama, Naka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/242,302
(22) PCT Filed: Mar. 24, 1997
(86) PCT No.: PCT/JP97/00965
§ 371 (c)(1),
(2), (4) Date: Feb. 12, 1999
(87) PCT Pub. No.: WO98/08255
PCT Pub. Date: Feb. 26, 1998

(30) Foreign Application Priority Data

Aug. 20, 1996 (JP) .............................. 8-218253

(51) Int. Cl.⁷ .......................................... H01L 21/8242
(52) U.S. Cl. ........................... 438/240; 438/3; 438/785; 438/788
(58) Field of Search ................ 257/184, 310; 438/240, 3, 608, 785, 788

(56) References Cited

U.S. PATENT DOCUMENTS

| | | |
|---|---|---|
| 5,270,298 A | 12/1993 | Ramesh |
| 5,453,908 A | 9/1995 | Tsu et al. |
| 5,516,363 A | 5/1996 | Azuma et al. |
| 5,527,567 A | 6/1996 | Desu et al. |

FOREIGN PATENT DOCUMENTS

| | | | |
|---|---|---|---|
| EP | 0489519 A2 | 6/1992 | |
| EP | 0574275 A1 | 12/1993 | |
| EP | 0600303 A2 | 6/1994 | |
| JP | 8-23073 A | * 1/1996 | .......... H01L/27/04 |
| WO | WO95/02897 | 1/1995 | |

OTHER PUBLICATIONS

Nikker Microdevices, 1994 Feb. Issue, Tokyo: Nikkei Business Publications, Inc., (Feb. 1, 1994, p. 99–103).*

Patent Abstracts of Japan, Publication No. 07172984, Publication Date–Jul. 11, 1995.

Han J.P., et al. "SrBi$_2$O$_9$(SBT) Thin Films Prepared by Electrostatic Spray", in *Integrated Ferroelectrics*, vol. 14, No. 1/04, Jan. 1, 1997, pp. 229–235.

Kamiyama, et al. "Ultrathin Tantalum Oxide Capacitor Process Using Oxygen–Plasma Annealing", in *Journal of the Electrochemical Society*, vol. 141, No. 5, May 1, 1994, pp. 1246–1251.

Singh R., et al. "Deposition of High Dielectric Constant Materials by Dual Spectral Sources Assisted Metalorganic Chemical Vapor Deposition", in *Appl. Phys. Lett.*, vol. 67, No. 26, Dec. 25, 1995, pp. 3939–3941.

* cited by examiner

Primary Examiner—Eddie Lee
Assistant Examiner—Drew Richards
(74) Attorney, Agent, or Firm—Antonelli, Terry, Stout & Kraus, LLP

(57) ABSTRACT

The temperature at which an oxide dielectric thin film is formed can be made lower than conventional by reducing the concentration of oxygen in an atmosphere for forming the thin film. As a result, there can be formed an oxide dielectric thin film which has a crystal structure preferentially oriented at a crystal plane allowing a polarization axis to be directed in the vertical direction, which eliminates any reaction with an electrode material, and controls the growth of crystal grains. The use of such an oxide dielectric thin film can provide an oxide dielectric element having a high spontaneous polarization and a small coercive field. Consequently, it is possible to achieve a dielectric element having a high density of integration for detecting reading and writing operations, and a semiconductor device using the same.

11 Claims, 8 Drawing Sheets

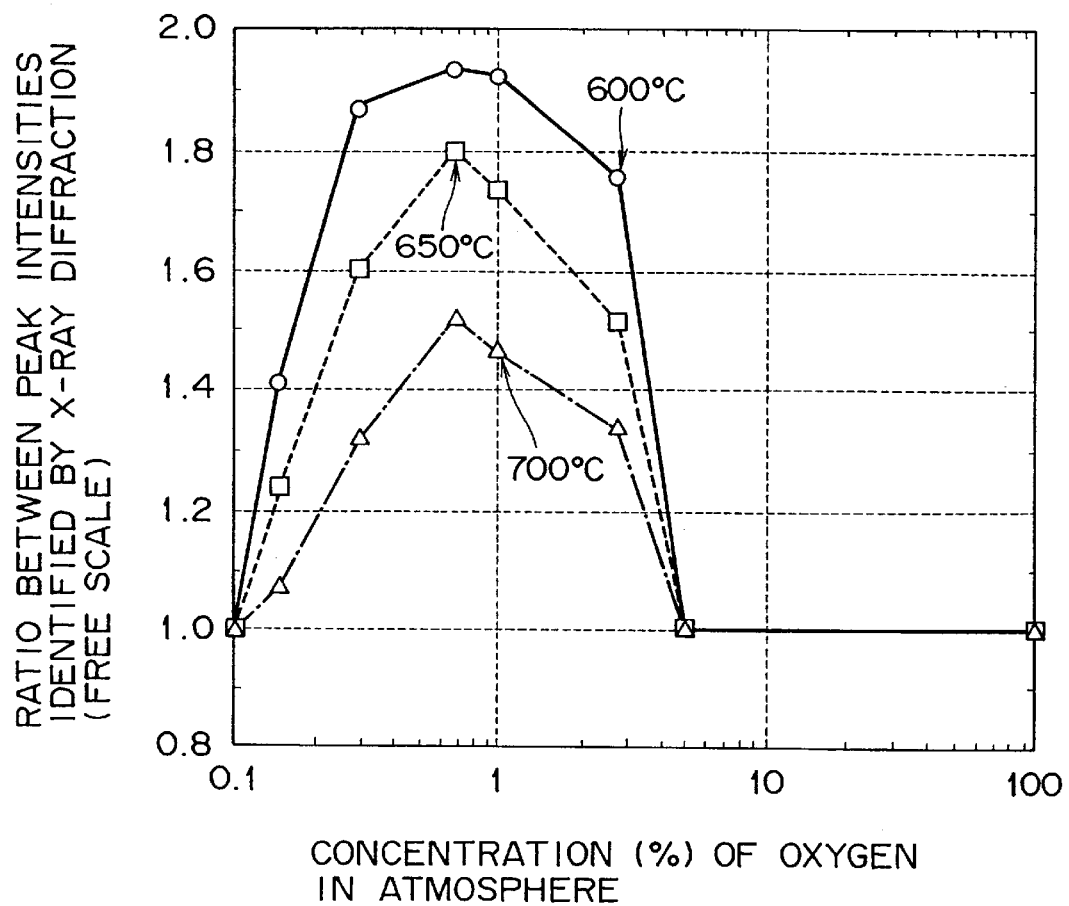
F I G. 1

SEMICONDUCTOR MOS STRUCTURE

METHOD OF PRODUCING OXIDE DIELECTRIC ELEMENT, AND MEMORY AND SEMICONDUCTOR DEVICE USING THE ELEMENT

TECHNICAL FIELD

The present invention relates to a method of producing an oxide dielectric element, and a memory and a semiconductor device using the element.

BACKGROUND OF THE INVENTION

One type of recent semiconductor memory is a ROM (Read Only Memory) which makes use of a non-volatile characteristic allowing retention of data even in the OFF-state of the power supply to the memory. The ROM, however, has problems in that the number of re-writing operations is largely limited, the re-writing speed is low, and the like. Another type of recent semiconductor memory is a RAM (Random Access Memory) having the advantage of enabling re-writing of data at a high speed. An oxide dielectric substance is used as a material of a storing capacitor, which is a basic component of the RAM. Oxide dielectric substances can be classified into a high dielectric substance having a high dielectric constant and a ferroelectric substance having a hysteresis of polarization. In particular, a DRAM using a high dielectric substance and a non-volatile RAM using a ferroelectric substance are known. First, the non-volatile PAM using a ferroelectric substance will be described. Such a non-volatile RAM is advantageous in that a non-volatile characteristic is obtained by making use of the hysteresis effect of the ferroelectric substance; the number of re-writing operations possible is as large as $10^{10}$ to $10^{12}$; and the re-writing speed is in $\mu s$ ($\frac{1}{1,000,000}$ sec) or faster in comparison with other types of memory, and therefore, the non-volatile RAM is expected to become the future ideal memory. Developments have been made to further enhance the capacity, the non-volatile characteristic and the re-writing speed of the non-volatile RAM. The non-volatile RAM, however, has a large problem in that film fatigue occurs with an increase in the number of re-writing operations, whereby the spontaneous polarization (Pr) property of the ferroelectric substance deteriorates. To enhance the capacity and durability of the non-volatile RAM, it is known to adopt (1) a ferroelectric material having a large spontaneous polarization (Pr) and (2) a ferroelectric material which is fatigue-free. As a ferroelectric material having a large spontaneous polarization (Pr) and which is fatigue-free, an oxide having a perovskite structure is extensively available. In particular, there is a Bi-layered ferroelectric substance, $SrBi_2Ta_2O_9$, having a crystal structure in which a plurality of simple lattices of the perovskite structure are layered. This material has a crystal anisotropy allowing the spontaneous polarization Pr to be directed only in a direction perpendicular to the c-axis, and the material has a good film fatigue characteristic, although the Pr value is not necessarily large. Examples of devices using such a material are disclosed in WO93/12542 (PCT/US92/10627) and Japanese Patent Laid-open No. Hei 5-24994.

Meanwhile, a DRAM using a high dielectric substance has ridden on the wave of development requiring a large capacity, for example, 16 Mbits, or even 64 Mbits, along with the advancements in high density and high integration techniques. To meet such a requirement, there has been a strong demand for making the geometries of a circuit component of the DRAM finer, particularly with respect to the geometries of a capacitor for storing information. To achieve the finer-geometries of the capacitor, attempts have been made to make a film of a dielectric material thin, to adopt a material having a high dielectric constant, and to assemble the structure having top and bottom electrodes and a dielectric substance not in two dimensions, but in three dimensions. For example, a high dielectric substance, BST [$(Ba/Sr)TiO_3$], having a crystal structure composed of a simple lattice of the perovskite structure is a material having a dielectric constant ($\in$) larger than that of a conventional high dielectric substance, $SiO_2/Si_3N_4$. An example using such a high dielectric substance has been reported in IEDM (International Electron Device Meeting) Tech. Dig.: 823, 1991.

SUMMARY OF THE INVENTION

The present invention relates to a method of producing an oxide dielectric element, and a memory and a semiconductor device using the same. In particular, the present invention is applicable to high dielectric elements, such as a DRAM, which makes use of a high dielectric constant and a low leakage current density, and a non-volatile RAM, which makes use of a high spontaneous polarization and a low coercive field; and a memory and a semiconductor device using the high dielectric element or the ferroelectric element.

Ferroelectric thin films and high dielectric thin films have been required to be heated up to high temperatures, for example, about 650° C. for a thin film of $Pb(Zr/Ti)O_3$, about 600° C. for a thin film of $(Ba/Sr)TiO_3$, and about 800° C. for a thin film of $SrBi_2Ta_2O_9$. That is to say, in the formation of a thin film of the above material having a perovskite type crystal structure, the material must be heated up to a temperature of 600° C. or higher for promoting crystallization. The heat treatment at such a high temperature, however, causes various problems. For example, in the formation of a film by a vapor deposition process, a bottom electrode is exposed to an oxidizing atmosphere at a high temperature at the initial stage of the film formation, and thus is susceptible of being peeled off. Furthermore, when a film of $SrBi_2Ta_2O_9$ is formed at a high temperature of 800° C. as conventional, Bi is evaporated to cause a deviation of the film composition, so that the starting content of Bi is required to be excessive. As a result, after the film formation at a high temperature, the excessive Bi exists as an irregular phase containing Bi in a large amount at grain boundaries of the ferroelectric layer, which causes degradation of the withstand voltage characteristic, and further, a transient layer is formed by diffusion of elements at the interplane between the ferroelectric thin film and each of the top and bottom electrodes, which reduces the spontaneous polarization (Pr) to thereby degrade the original characteristics of the ferroelectric element, increases the coercive field (Ec), and causes the film fatigue. For this reason, the number of re-writing operations performed by reversing an electric field is largely limited. Further, the heat treatment at a high temperature creates problems such as (a) the formation of the reaction layer reduces the dielectric constant and spontaneous polarization, and (b) the growth of crystal grain increases the leakage current density. This leads to an increased operational voltage, thus making it difficult to achieve high integration of the element.

The present invention has been made on the basis of the above knowledge, and an object of the present invention is to provide a method of producing an oxide dielectric element having good characteristics, particularly, a ferroelectric element having a high spontaneous polarization and a low coercive field, or a high dielectric element having a high dielectric constant and a good withstand voltage characteristic; and to provide a memory and a semiconductor device using the above oxide dielectric element.

According to one feature of the present invention, there is provided a method of producing an oxide dielectric element, particularly, a ferroelectric element having a high spontaneous polarization and a low coercive field or a high dielectric element having a high dielectric constant and a good withstand voltage characteristic, characterized in that a ferroelectric thin film as a main part of the ferroelectric element or a high dielectric thin film as a main part of the high dielectric element is formed in a low oxygen concentration atmosphere at a temperature of 650° C. or less for the ferroelectric thin film or 600° C. or less for the high dielectric thin film. In this case, to maximize the occupied ratio of a perovskite structure in the entire crystal phase in the thin film and hence to enhance the electric characteristics of the element, the concentration of oxygen in the low oxygen concentration atmosphere may be preferably set in a range which is greater than 0.1% and less than 5.0%.

According to another feature of the present invention, there is provided a method of producing an oxide dielectric element, characterized in that the low oxygen concentration atmosphere is made variable by adjusting the mixing ratio of oxygen to inert gas, and the heat treatment is carried out at atmospheric pressure. With this configuration, the production method can be made very simple.

According to a further feature of the present invention, there is provided a method of producing an oxide dielectric element, characterized in that the ferroelectric thin film or high dielectric thin film formed in accordance with the above-described production method is re-heated in an activated oxygen atmosphere of $O_3$, $N_2O$, radical oxygen or the like. With this configuration, the quality of the ferroelectric or high dielectric thin film can be enhanced.

According to the present invention, the ferroelectric thin film is characterized in that it is expressed by a chemical structural formula of $(AO)^{2+}(BCO)^{2-}$ where A is one kind of element selected from a group consisting of Bi, Tl, Hg, Pb, Sb and As; B is at least one kind of element selected from a group consisting of Pb, Ca, Sr, Ba and rare earth elements; and C is at least one kind of element selected from a group consisting of Ti, Nb, Ta, W, Mo, Fe, Co and Cr; or expressed by a chemical structural formula of $(Pb/A)(Zr/Ti)O_3$ where A is one kind of element selected from a group consisting of La, Ba and Nb.

The high dielectric thin film is characterized in that it is expressed by a chemical structural formula of $(Ba/Sr)TiO_3$.

The high dielectric thin film obtained according to the present invention is characterized in that it has a dielectric constant larger than that of $Ta_2O_5$ conventionally used.

Each of the top and bottom electrode materials used in accordance with the present invention is characterized in that it consists of at least one kind of metal selected from a group consisting of Pt, Au, Al, Ni, Cr, Ti, Mo and W; at least one kind of conductive oxide of a single element selected from a group consisting of Ti, V, Eu, Cr, Mo, W, Ph, Os, Ir, Pt, Re, Ru and Sn; or at least one kind of conductive oxide having a perovskite structure selected from a group consisting of $ReO_3$, $SrReO_3$, $BaReO_3$, $LaTiO_3$, $SrVO_3$, $CaCrO_3$, $SrCrO_3$, $SrFeO_3$, $La_{1-x}Sr_xCoO_3$ ($0<x<0.5$), $LaNiO_3$, $CaRuO_3$, $SrRuO_3$, $SrTiO_3$ and $BaPbO_3$. In the case of using a conductive oxide of a single element or a conductive oxide having a perovskite structure, the oxide is characterized in that it has a resistivity of 1 m$\Omega$·cm or less for ensuring the function of an electrode material.

According to the present invention, the method of producing the ferroelectric thin film or high dielectric thin film is characterized in that the thin film is formed by a sputtering process, a Pulsed Laser deposition process or a MOCVD (Metal Organic Chemical Vapor Deposition) process in an atmosphere of a mixed gas of oxygen and an inert gas. The thin film may be formed by a spin coating process or a dip coating process using a metal alkoxide or an organic acid salt as a starting material in an atmosphere of a mixed gas of oxygen and an inert gas under normal pressure.

In the method of producing the ferroelectric thin film or high dielectric thin film according to the present invention, the re-heating treatment is performed by a sputtering process, a Pulsed Laser deposition process or a MOCVD (Metal Organic Chemical Vapor Deposition) process in ECR-oxygen plasma. The re-heating treatment may be performed by a spin coating process or a dip coating process using a metal alkoxide or an organic acid salt as a starting material by irradiation with light in an ultraviolet region.

BRIEF DESCRIPTION OF DRAWINGS

FIG. 1 is a graph showing a change in crystal structure of a ferroelectric thin film depending on a concentration of oxygen in an atmosphere according to the present invention;

BEST MODES FOR CARRYING OUT THE INVENTION

Figure 2:
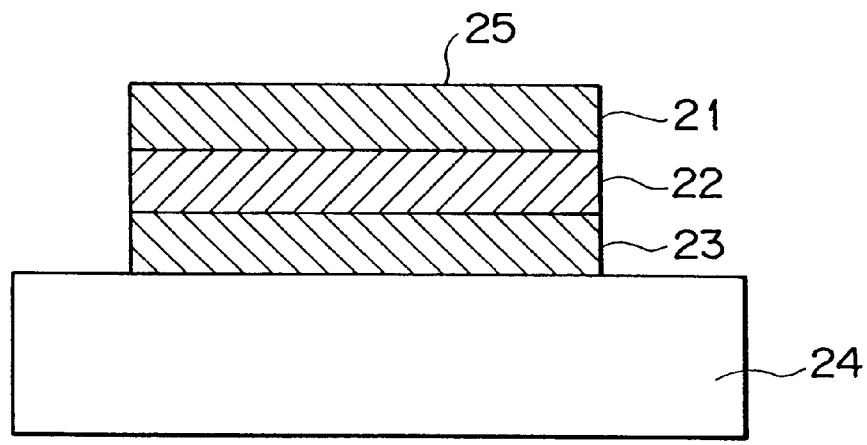
FIG. 2 is a sectional view showing a ferroelectric element according to the present invention.

Hereinafter, the present invention will be described, without limitation, by way of various. embodiments and with reference to the drawings.

Principal reference numerals used in the drawings designate elements as follows:

21, 31, 61, 71 and 1008 denote a top electrode; 41 denote a top electrode (conductive oxide); 22, 42, 62 and 1007 denote a ferroelectric thin film; 32 and 72 denote a high dielectric thin film; 23, 33, 63, 73 and 1006 denote bottom electrode; 43 denotes a bottom electrode (conductive oxide); 24, 34 and 44 denote an underlying substrate; 25 and 45 denote a ferroelectric element; 35 denotes a high dielectric element; 64, 74 and 1002 denote an Si substrate; 65 and 75 denote a source region; 66 and 76 denote a drain region; 67 and 79 denote polycrystal Si; 68, 77, and 78 denote $SiO_2$; 1001 denotes a non-contact type semiconductor device; 1003 denotes a diffusion layer; 1004 denotes an $SiO_2$ gate layer; 1005 denotes a gate electrode; 1009 and 1010 denote an $SiO_2$ insulating layer; and 1011 denotes an aluminum interconnection.

(First Embodiment)

One embodiment of the present invention will be described.

A feature of the present invention will be described in detail. The ratio of occupation of a perovskite structure in the entire crystal phase of the thin film can be increased by controlling the atmosphere for forming a ferroelectric thin film or a high dielectric thin film according to the present invention by reducing the concentration of oxygen contained in the atmosphere. For a ferroelectric substance $SrBi_2Ta_2O_9$, when the concentration of oxygen in the atmosphere is minimized, formation of a liquid phase caused by decomposition of oxides is promoted even at a low temperature, to thereby achieve crystallization of the ferroelectric substance at a temperature lower than conventional, that is, 800° C. The reduction in the formation temperature is also effective to prevent a reaction between the ferroelectric substance and each of the top and bottom electrodes.

The ferroelectric thin film used in this embodiment is expressed by the chemical structural formula: $(AO)^{2+}(BCO)^{2-}$, where A is Bi, B is Sr, and C is Ta. Hereinafter, there will be described a method of producing such a ferroelectric thin film. FIG. 2 shows the structure of a ferroelectric element according to this embodiment, in which a bottom electrode 23 is formed on an underlying substrate, the ferroelectric thin film 22 is formed on the bottom electrode, and an top electrode 21 is formed on the ferroelectric thin film. In addition, reference numeral 24 designates the underlying substrate. An Si base, on which an $SiO_2$ film was formed by thermal oxidation, was used as the underlying substrate 24. The bottom electrode 23 (Pt) having a thickness of 2,000 Å was formed on the underlying substrate 24 at room temperature by sputtering. To form the ferroelectric dielectric thin film 22 on the bottom electrode 23, the surplane of the bottom electrode 23 was spin-coated with a metal alkoxide solution having a composition of Bi:Sr:Ta=2:1:2 at 3,000 rpm (the number of rotation per minute) for 30 sec. The resultant substrate was dried at 150° C. for 10 min, and then, pre-heated in air or oxygen at a temperature lower than the crystallization temperature of the ferroelectric thin film, concretely, at 500° C. for 15 min. The above procedure was repeated three times to form a precursor thin film having a thickness of 2,400 Å. Finally, the precursor thin film was heat-treated in an atmosphere containing oxygen at a varying concentration at 650° C. for 1 hr to produce a ferroelectric thin film. The crystal structure of the ferroelectric thin film was identified by X-ray diffraction.

FIG. 1 shows a change in the ratio of occupation of a perovskite structure in the entire crystal phase of a thin film depending on the concentration of oxygen in atmospheric gas. The reduced concentration of oxygen functions to increase the ratio of occupation of the perovskite structure. More specifically, the increase in the ratio of occupation of the perovskite structure is maximized at the concentration of oxygen in a range of 0.2 to 3.0%. As a result, the concentration of oxygen in the atmospheric gas for forming the ferroelectric thin film may be preferably in a range of more than 0.1% and less than 5.0%. When the concentration of oxygen is equal to or less than 0.1%, the amount of oxygen required for forming the perovskite structure is insufficient, so that it is difficult to form the perovskite structure. When it is equal to or more than 5.0%, the effect of forming the perovskite structure is no longer obtained. FIG. 1 also shows a change in the ratio of occupation of the perovskite structure in the entire crystal phase of the thin film depending on the concentration of oxygen in the atmosphere when the formation temperature is changed in a range of 600 to 700° C. The effect of the low oxygen concentration exerted on the ratio of occupation of the perovskite structure becomes more effective as the formation temperature becomes lower. According to this embodiment, it may be desirable to form a ferroelectric thin film at a temperature of 650° C. or less and to form a high dielectric thin film at a temperature of 600° C. or less. In this case, the bottom limit of the formation temperature may desirably be set at 400° C., because it is difficult to form the perovskite structure by heat treatment at a temperature less than 400° C.

Figure 8:
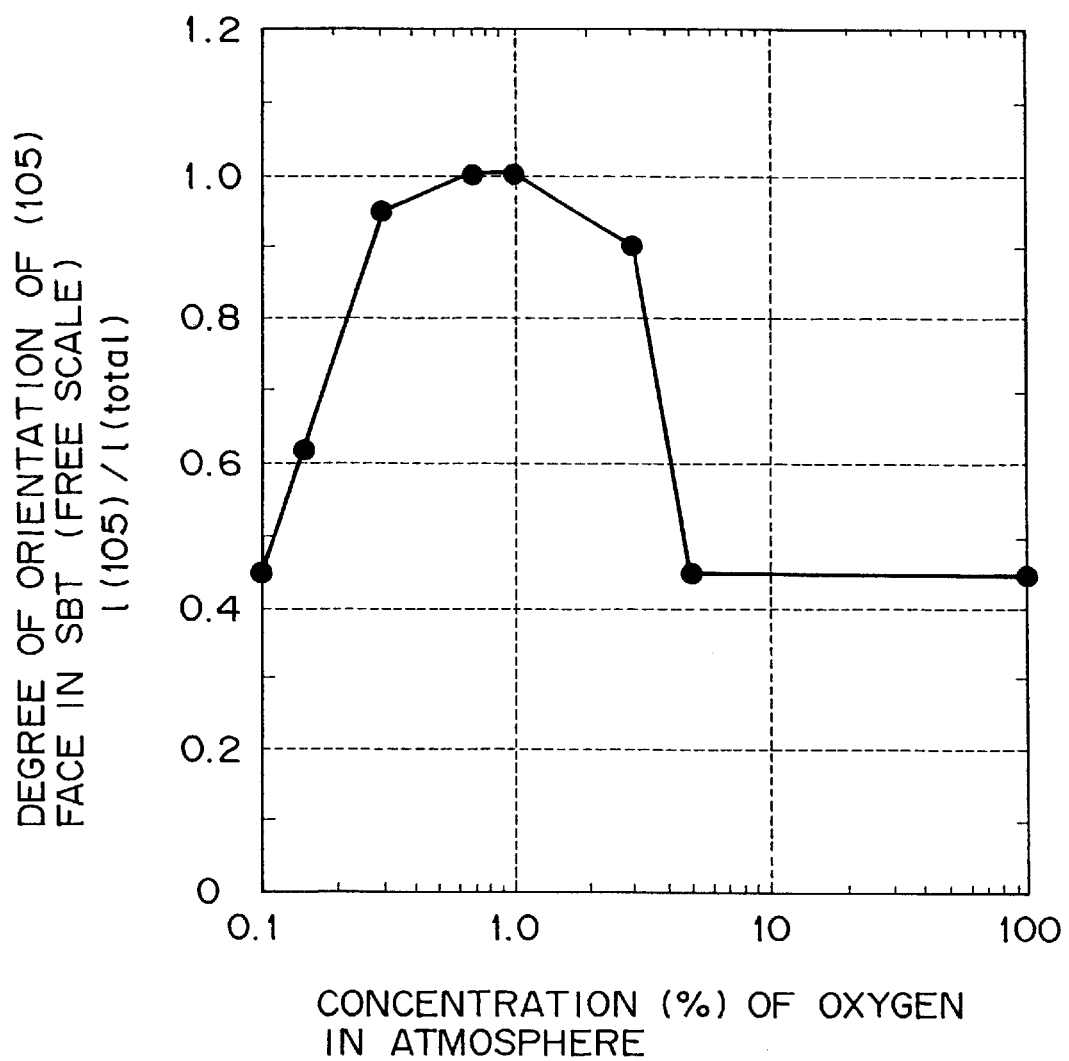
FIG. 8 is a graph showing a degree of orientation of the (105) plane of the crystal structure depending on the concentration of oxygen in an atmosphere according to the present invention.

FIG. 8 shows a relationship between a degree of orientation of the (105) plane of the perovskite structure and a concentration of oxygen. The degree of orientation is expressed by a ratio of a peak intensity I(105) of the (105) plane to a peak intensity I(total) of the total crystal planes identified by X-ray diffraction. When the concentration of oxygen is less than 5%, the degree of orientation of the (105) plane becomes large. This means that the crystal structure of the $SrBi_2Ta_2O_9$ ferroelectric thin film formed at a low oxygen concentration is strongly oriented at the (105) plane. The reason for this is that a liquid phase is partially produced by decomposition of oxides of the components at a low oxygen concentration and crystal growth is originated from the liquid phase, to thereby make it easy to achieve preferential growth of the (105) plane. That is to say, the low oxygen concentration is effective to make it easy to set the orientation of the crystal structure at the (105) plane. The $SrBi_2Ta_2O_9$ ferroelectric thin film having a layered perovskite structure exhibits a crystal anisotropy allowing the polarization axis to be directed only in parallel to the Bi—O layer (perpendicular to the c-axis) because of the symmetry of the crystals. However, since the $SrBi_2Ta_2O_9$ ferroelectric thin film in this embodiment is preferentially oriented at the (105) plane, such a thin film can exhibit good characteristics. In addition, even a different ferroelectric material can be preferentially oriented at a crystal plane allowing the polarization axis to be directed in the vertical direction.

Next, a Pt film having a thickness of 2,000 Å was formed on the ferroelectric thin film 22 expressed by the chemi-cal-structural formula, $(BiO)^{2+}(SrTaO)^{2-}$, at room temperature by sputtering, to form the top electrode 21 on the ferroelectric thin film 22. In this way, a ferroelectric element 25 was obtained. The spontaneous polarization (Pr) and the coercive field (Ec) of the ferroelectric element thus obtained were measured at room temperature. The results are shown in Table 1.

TABLE 1

| Conc. of $O_2$ (%) | 0.15 | 0.2 | 0.7 | 1.0 | 3.0 | 5.0 |
|---|---|---|---|---|---|---|
| Pr ($\mu C/cm^2$) | 7 | 17 | 20 | 18 | 17 | 6 |
| Ec (kV/cm) | 70 | 52 | 45 | 50 | 53 | 74 |
| Number of rewriting operations | 1E+14 | 1E+14 | 1E+14 | 1E+14 | 1E+14 | 1E+13 |

Figure 11:
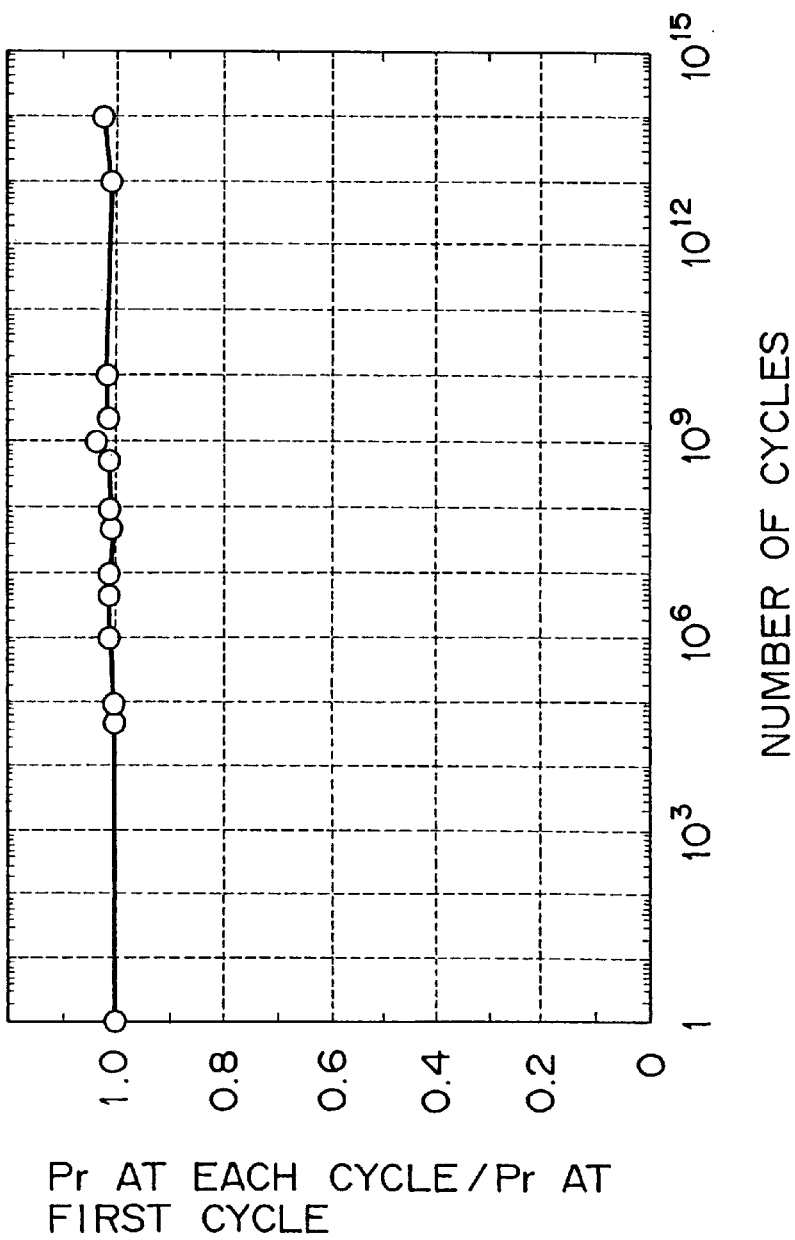
FIG. 11 is a graph showing the result of measuring a number of cycles of operation of the ferroelectric element of the present invention.

The value Pr is a polarization quantity obtained at a positive or negative maximum applied voltage in the hysteresis of the Pr-V curve. The value Pr is high and the value Ec is low at a concentration of oxygen in a range of 0.2 to 3.0%. This corresponds to the results of X-ray diffraction. In particular, the ferroelectric thin film formed at an oxygen concentration of 0.7% exhibits a value Pr of 20 $\mu$C/cm$^2$ and a value Ec of 45 kV/cm. Each ferroelectric thin film formed in this embodiment was measured in terms of the number of cycles in which a voltage of 136 kV/cm was repeatedly applied to the thin film with the polarity of the voltage reversed. FIG. 11 typically shows the measurement result of the ferroelectric thin film formed at the oxygen concentration of 0.7%. For each ferroelectric thin film formed at an oxygen concentration in a range of 0.15 to 3.0%, degradation of the Pr characteristic is not observed until the number of cycles reaches 10$^{14}$ times.

A ferroelectric element including a ferroelectric thin film having a chemical structural formula of $(AO)^{2+}(Sr,TaO)^{2-}$ where the element of the A site is selected from a group consisting of Tl, Hgl Pb, Sb and As was produced in the same procedure as that described above. The values Pr and Ec of each ferroelectric element thus obtained were measured. As a result, the value Pr was in a range of 19 to 21 $\mu$C/cm$^2$ and the value Ec was in a range of 44 to 48 kV/cm.

A ferroelectric element including a ferroelectric thin film expressed by the chemical structural formula: $(BiO)^{2+}(BTaO)^{2-}$, where the element of the B site is selected from a group consisting of Pb, Ca and Ba was produced using the same procedure as that described above. The values Pr and Ec of the ferroelectric element thus obtained were measured. As a result, the value Pr was in a range of 18 to 22 $\mu$C/cm$^2$ and the value Ec was in a range of 43 to 47 kV/cm.

A ferroelectric element including a ferroelectric thin film expressed by the chemical structural formula: $(BiO)^{2+}(SrCO)^{2-}$, where the element of the C site is selected from a group consisting of Ti, Nb, W, Mo, Fe, Co and Cr was produced using the same procedure as that described above. The values Pr and Ec of the ferroelectric element thus obtained were measured. As a result, the value Pr was in a range of 17 to 22 $\mu$C/cm$^2$ and the value Ec was in a range of 42 to 49 kV/cm.

Moreover, in the first embodiment, since the ferroelectric thin film can be formed at a low temperature by reducing the concentration of oxygen, there is no problem in the formation of a transient layer or with diffusion of the elements, so that a structure may be adopted in which no diffusion preventive layer is provided between the thin film and the underlying substrate.

(Second Embodiment)

The ferroelectric thin film used in this embodiment is expressed by a chemical structural formula: (Pb/A) (Zr/Ti)O$_3$, where A is La. Hereinafter, there will be described a method of producing such a ferroelectric thin film. In FIG. 2, which is a sectional view of the ferroelectric element, reference numeral 24 designates an underlying substrate. An Si base, on which an SiO$_2$ film was formed by thermal oxidation, was used as the underlying substrate 24. A Pt film having a thickness of 2,500 Å, as a bottom electrode 23, was formed on the underlying substrate 24 in vacuum at room temperature by sputtering. To form a ferroelectric dielectric thin film 22 on the bottom electrode 23, the surplane of the bottom electrode 23 was spin-coated with a metal alkoxide solution having a composition of Pb:La:Zr:Ti= 0.95:0.05:0.52:0.48 at 2,500 rpm for 30 sec. The resultant substrate was dried at 140° C. for 13 min, and then, pre-heated in air or oxygen at a temperature lower than the crystallization temperature of the ferroelectric thin film 22, concretely, at 450° C. for 20 min. The above procedure was repeated three times to form a precursor thin film having a thickness of 1,700 Å. Thereafter, the precursor thin film was heat-treated in a low oxygen atmosphere at 550° C. to produce the ferroelectric thin film 22 expressed by the chemical structural formula: (Pb/A) (Zr/Ti)O$_3$. The crystal structure of the ferroelectric thin film was identified by X-ray diffraction. The results showed that, like the first embodiment, the ratio of occupation of the perovskite structure in the entire crystal phase of the thin film was rapidly increased at the concentration of oxygen in a range of 0.2 to 3.0%. Next, a Pt film having a thickness of 2,000 Å, as an top electrode 21, was formed on the ferroelectric thin film 22 expressed by the chemical structural formula, (Pb/A) (Zr/Ti)O$_3$, in a vacuum at room temperature by sputtering. In this way, a ferroelectric element 25 was obtained. The spontaneous polarization (Pr) and the coercive field (Ec) of the ferroelectric element thus obtained were measured. As a result, the value Pr was 20 $\mu$C/cm$^2$ and the value Ec was 50 kV/cm at the oxygen concentration of 0.7%. Further, the dielectric constant ($\in$) of the ferroelectric element was measured at room temperature. The results are shown in Table 2.

TABLE 2

| Conc. of O$_2$ (%) | 0.15 | 0.2 | 0.7 | 1.0 | 3.0 | 5.0 |
|---|---|---|---|---|---|---|
| $\in$ | 1320 | 1560 | 1590 | 1570 | 1564 | 1290 |
| J(A/cm$^2$) at 3V | 7E−7 | 2E−7 | 1E−7 | 3E−7 | 4E−7 | 3E−6 |

The value $\in$ was 1590 at the oxygen concentration of 0.7%. Further, the ferroelectric element was measured in terms of a relationship between an applied voltage and a leakage current density. As a result, the leakage current density was 1×10$^{-7}$ A/cm$^2$ or less at an applied voltage of 3 V. Accordingly, it was confirmed that the ferroelectric element in this embodiment had a very good withstand voltage characteristic.

A ferroelectric element including a ferroelectric thin film expressed by the chemical structural formula: (Pb/A) (Zr/Ti)O$_3$, where A is Ba or Nb, was produced using the same procedure as that described above. The values Pr and Ec of each ferroelectric element were measured. As a result, the value Pr was 20 $\mu$C/cm$^2$ and the value Ec was 51 kV/cm. The dielectric constant of the ferroelectric element was also estimated at room temperature. As a result, the ferroelectric element exhibited a dielectric constant which was as high as 1590 to 1610 at an oxygen concentration of 0.2 to 3.0%. In particular, even the ferroelectric thin film expressed by the chemical structural formula: (Pb/A) (Zr/Ti)O$_3$, where A is Ba, Nb or Ti, which was orientated at the (111) plane, exhibited a high polarization characteristic.

(Third Embodiment)

Figure 3:
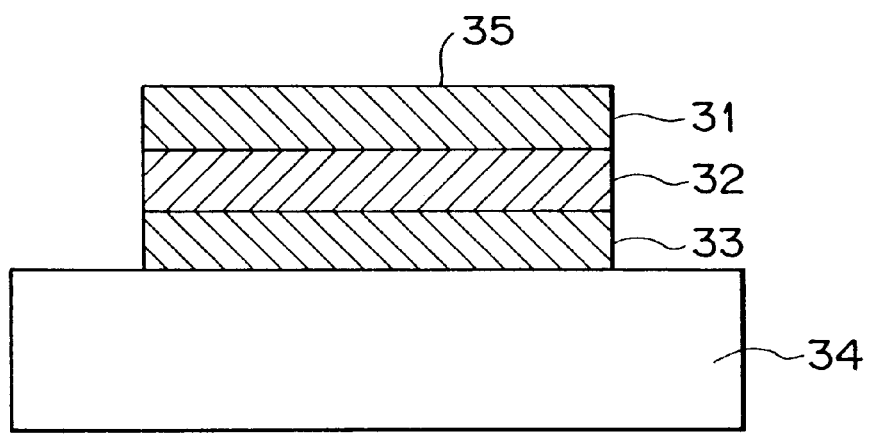
FIG. 3 is a sectional view showing a high dielectric element according to the present invention.

A method of producing a high dielectric thin film having a composition of (Ba$_{0.5}$Sr$_{0.5}$)TiO$_3$ according to this embodiment will be described. In FIG. 3, which is a sectional view of a high dielectric element, reference numeral 34 designates an underlying substrate. The same Si base as that in the second embodiment was used as the underlying substrate 34. A Pt film having a thickness of 2,000 Å, as a bottom electrode 33, was formed on the underlying substrate 34 in a vacuum at room temperature by sputtering. To form a ferroelectric dielectric thin film 32 on the bottom electrode 33, a precursor thin film having a thickness of 100 nm was formed on the bottom electrode 33 in a mixed gas of oxygen and argon at a temperature of 300° C. and at a pressure of 0.55 Pa. To form a perovskite structure, the precursor thin film was heat-treated in the atmosphere containing oxygen at a low concentration at 500° C., to form a high dielectric thin film having the composition of $(Ba_{0.5}Sr_{0.5})TiO_3$. The crystal structure of the high dielectric thin film was examined by X-ray diffraction. The results showed that, like the first embodiment, the ratio of occupation of the perovskite structure in the entire crystal phase of the thin film began to be increased as the oxygen concentration was reduced to less than 5%, and it was maximized at an oxygen concentration of 0.2 to 3.0%. Then, a Pt film having a thickness of 2,000 Å, as an top electrode 31, was formed on the high dielectric thin film 32 having the composition of $(Ba_{0.5}Sr_{0.5})TiO_3$ in a vacuum at room temperature by sputtering. In this way, a high dielectric element 35 was obtained. The dielectric constant ($\in$) of the high dielectric element 35 was measured at room temperature. The results are shown in Table 3.

TABLE 3

| Conc. of $O_2$ (%) | 0.15 | 0.2 | 0.7 | 1.0 | 3.0 | 5.0 |
|---|---|---|---|---|---|---|
| $\epsilon$ | 310 | 493 | 520 | 503 | 480 | 253 |

The high dielectric element exhibited a dielectric constant which was as high as 480 to 520 at an oxygen concentration of 0.2 to 3.0%.

(Fourth Embodiment)

Figure 4:
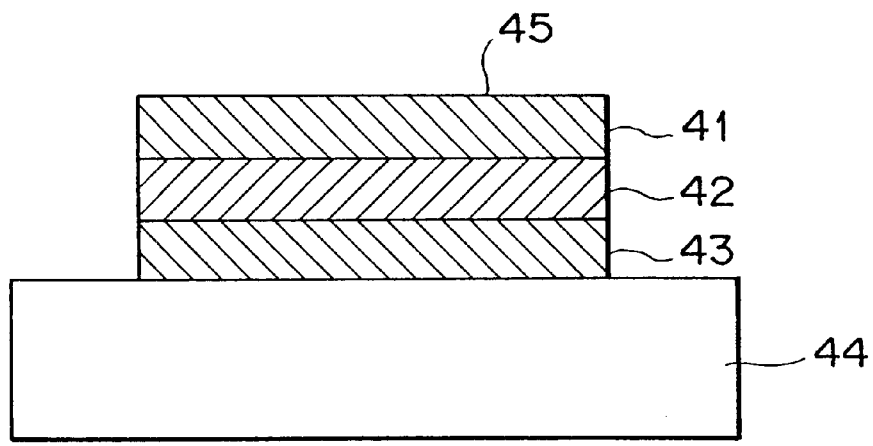
FIG. 4 is a sectional view showing a ferroelectric element in which a conductive oxide of the present invention is used for an electrode.

The ferroelectric thin film used in this embodiment is expressed by the chemical structural formula: $(AO)^{2+}(BCO)^{2-}$, where A is Bi, B is Sr, and C is Nb. Hereinafter, there will be described a method of producing such a ferroelectric thin film. In FIG. 4, which is a sectional view of a ferroelectric element, reference numeral 44 designates an underlying substrate. An Si base, on which an $SiO_2$ film was formed by thermal oxidation, was used as the underlying substrate 44. A film (thickness: 1,700 Å) made from conductive oxide of a single element, RuO, was formed on the underlying substrate 44 in an oxygen gas atmosphere at 450° C. by sputtering. To form a ferroelectric thin film on the bottom electrode 43, the surplane of the bottom electrode 43 was spin-coated with a metal alkoxide solution containing Bi, Sr and Nb at 3,000 rpm for 25 sec. The resultant substrate was dried at 150° C. for 10 min, and then, pre-heated in air or oxygen at 450° C. for 10 min. the above procedure as repeated three times to form a precursor thin film having a thickness of 2,300 A. The precursor thin film was heated in a low oxygen concentration atmosphere containing argon gas and oxygen at a concentration of 0.7% at 600° C. to produce a ferroelectric thin film 42, $(BiO)^{2+}(SrNbo)^{2-}$, having the perovskite structure. Next, a film (thickness: 1,700 Å) made from the conductive oxide of the single element RuO, as a top electrode 41, was formed on the ferroelectric thin film 42 in an oxygen gas atmosphere at 450° C. by sputtering. In this way, a ferroelectric element 45 was produced. The spontaneous polarization (Pr) and the coercive field (Ec) of the ferroelectric element 4S thus obtained were measured at room temperature. As a result, the value Pr was 19 $\mu PC/cm^2$ and the value Ec was 46 kV/cm.

Each ferroelectric element having the same structure as that described above except that the electrode material was changed from RuO into any one of $TiO_x$, $VO_x$, EuO, $CrO_2$, $MoO_2$, $WO_2$, PhO, OsO, IrO, PtO, $ReO_2$, $RuO_2$ and $SnO_2$, was produced using the same procedure as that described above. The values Pr and Ec of each ferroelectric element were measured. As a result, the value Pr was in a range of 18 to 22 $\mu C/cm^2$ and the value Ec was in a range of 44 to 48 kV/cm. As described above, by use of a conductive oxide of a single element, which has a resistivity of 1 m $\Omega \cdot cm$ or less for ensuring a function as a metal or an electrode material, or one kind of conductive oxide having the perovskite structure, as the material of each of the top and bottom electrodes used in this embodiment, there can be produced an oxide dielectric element having good electrical characteristics.

(Fifth Embodiment)

A bottom electrode (Pt) was formed on an underlying substrate in accordance with the same production method as that in the first embodiment. Next, to form a ferroelectric thin film expressed by the chemical structural formula: $(AO)^{2+}(BCO)^{2-}$, where A is Bi, B is Sr, and C is Ta, the bottom electrode was spin-coated with a metal alkoxide solution having the same composition as that in the first embodiment at 3,000 rpm for 35 sec. The resultant substrate was dried at 150° C. for 10 min, and then, pre-heated in air or oxygen at 400° C. for 10 min. The above procedure was repeated twice to form a precursor thin film having a thickness of 1,100 Å. The precursor thin film was heated in an atmosphere containing oxygen at a low concentration at 630° C. to produce a ferroelectric thin film. For comparison, a ferroelectric thin film, which was prepared by forming a bottom electrode on an underlying substrate and forming a ferroelectric thin film having the same composition as that described above at a low oxygen concentration in accordance with the same procedure as that described above, was further heated in an ECR oxygen plasma at 400° C. An top electrode (Pt) was formed on each ferroelectric thin film thus obtained, using the same procedure as that in the first embodiment, to thus produce a ferroelectric element having the cross-sectional structure shown in FIG. 2. The spontaneous polarization (Pr) and the coercive field (Ec) of each ferroelectric element were measured at room temperature. The results are shown in Table 4.

TABLE 4

| Atmosphere | No heating | Radical oxygen | $N_2O$ | $O_3$ |
|---|---|---|---|---|
| Pr ($\mu C/cm^2$) | 19 | 30 | 27 | 28 |
| Ec (kV/cm) | 43 | 35 | 34 | 31 |

The ferroelectric element re-heated in the ECR oxygen plasma is higher in spontaneous polarization and lower in coercive field than a ferroelectric element not subjected to reheating treatment. Similarly, the ferroelectric element was re-heated using each of $O_3$, radical oxygen, and $N_2O$ (nitrous oxide). Each of the ferroelectric elements thus re-heated exhibited a spontaneous polarization and a coercive field comparable to those of the ferroelectric element re-heated in the ECR oxygen plasma. As described above, the re-heating treatment of a ferroelectric thin film in an activated oxygen atmosphere having a strong oxidizing function forms the perovskite structure without any loss in oxygen, to thereby remarkably enhance the electrical characteristics of the ferroelectric element, including the ferroelectric thin film. The re-heating treatment may be preferably performed at a temperature equal to or less than the crystallization temperature of a ferroelectric thin film at a low oxygen concentration.

(Sixth Embodiment)

A bottom electrode (Pt) was formed on an underlying substrate in accordance with the same production method as that used in the first embodiment. Next, to form a ferroelectric thin film expressed by the chemical structural formula: $(AO)^{2+}(BCO)^{2-}$, where A is Bi, B is Sr, and C is Ta, the bottom electrode was spin-coated with a metal alkoxide solution having a composition of Bi:Sr:Ta=2.2:1:2 at 3,500 rpm for 25 sec. The resultant substrate was dried at 170° C. for 10 min, and then, preheated at 450° C. for 10 min. The above procedure was repeated three times to form a precursor thin film having a thickness of 2,200 Å. The precursor thin film was heat-treated in an atmosphere containing oxygen at a concentration of 0.7% at 650° C. for 1 hr to form a ferroelectric thin film. For comparison, a precursor thin film prepared in accordance with the same procedure as that described above was heat-treated in an atmosphere of 100% oxygen at 650° C. for each treatment time of 1 hr and 5 hr, to form a ferroelectric thin film. A top electrode (Pt) was formed on each of the ferroelectric elements thus obtained using the same procedure as that used in the first embodiment, to thus produce a ferroelectric element having the cross-sectional structure shown in FIG. 2. The Pr of each ferroelectric element was measured at room temperature. As a result, for the ferroelectric element formed at the oxygen concentration of 0.7%, the value Pr $\mu C/cm^2$ was 22 while for the ferroelectric element (treatment time: 1 hr) formed at the oxygen concentration of 100%, the hysteresis curve of polarization was not observed and for the ferroelectric element (treatment time: 0.5 hr) formed at the oxygen concentration of 100%, the value Pr was as low as 10 $\mu C/cm^2$. In this way, it is seen that a decrease in the oxygen concentration has an effect of shortening the heat treatment time. The reason for this is that, as described above, the rate of crystal growth which originates from a liquid phase caused by decomposition of oxides in the components is increased by a decrease in oxygen concentration, and accordingly, the thin film formed at a low oxygen concentration forms the perovskite structure in a short treatment time which is about one-fifth that of the thin film formed at the conventional oxygen concentration (100%), to thereby obtain high electrical characteristics. The results of the component analysis for each ferroelectric thin film show that the ferroelectric thin film formed in the atmosphere of a low oxygen concentration has a stoiehiometric composition of Sr:Bi:Ta=1:2:2; while the ferroelectric thin film formed in the atmosphere of 100% oxygen has a Bi-rich composition of Sr:Bi:Ta=1:2.2:2. In this embodiment, a ferroelectric thin film is formed in an atmosphere of a low oxygen concentration at a low temperature, and accordingly, for example, a $SrBi_2Ta_2O_9$ ferroelectric thin film having a stoichiometric composition can be formed irrespective of the starting content of Bi. This eliminates the necessity of making the starting content of Bi excessive. Even if the starting content of Bi is excessive, it is possible to suppress the formation of an irregular phase containing Bi in a large amount at grain boundaries of a ferroelectric layer after formation of a ferroelectric thin film, and hence to enhance the withstand voltage characteristic of the thinfilm. Further, since there is no reaction between the ferroelectric thin film and each of the top and bottom electrodes,, it is possible to enhance the dielectric constant of the ferroelectric thin film.

In this embodiment, description is made by way of example concerning the use of a $SrBi_2Ta_2O_9$ ferroelectric thin film; however, even for an oxide dielectric thin film expressed by the chemical structural formula: $Pb(Zr/Ti)O_3$, $(Ba/Sr)TiO_3$ or the like, the heat treatment time required for forming the thin film can be shortened.

(Seventh Embodiment)

Figure 9:
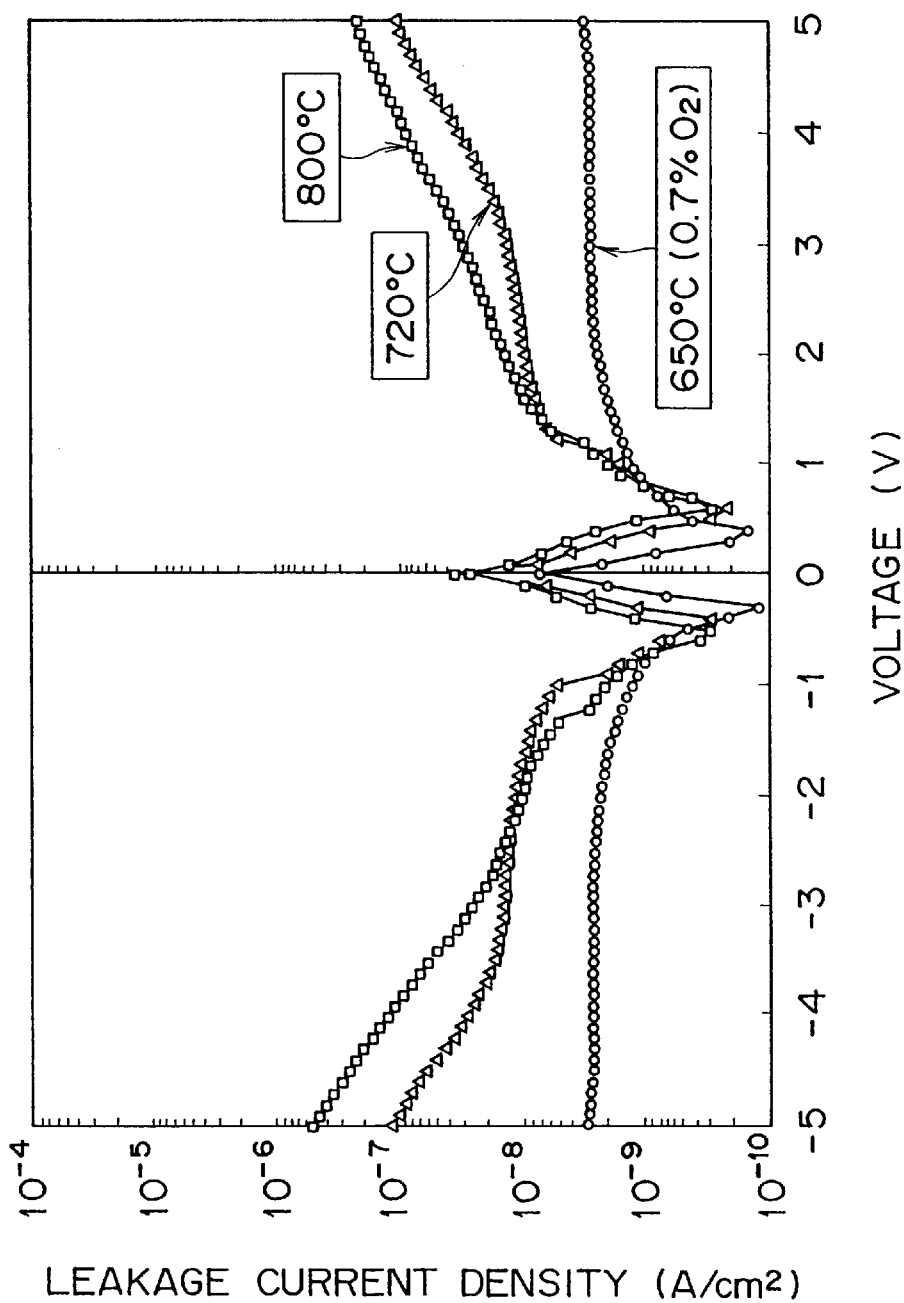
FIG. 9 is a graph showing a relationship between a voltage and a leakage current density according to the present invention.

A Pt bottom electrode having a thickness of 2,000 Å was formed on an underlying substrate composed of an Si base on which $SiO_2$ was formed, in accordance with the same production method as that used in the first embodiment. To form a ferroelectric thin film on the Pt bottom electrode, the bottom electrode was spin-coated with a metal alkoxide solution having a composition of Bi:Sr:Ta=2:1:2 at 2,000 rpm for 30 sec. The resultant substrate was dried at 150° C. for 15 min, and then, pre-heated at 450° C. for 20 min. The above procedure was repeated five times to form a precursor thin film having a thickness of 2,000 Å. The precursor thin film was heat-treated in an atmosphere containing oxygen at a concentration of 0.7% at 650° C. for 1 hr to produce a ferroelectric thin film. For comparison, the same precursor thin film was heat-treated at each of 800° C. and 720° C. for 1 hr in an atmosphere of 100% oxygen, to form a ferroelectric thin film. A Pt top electrode having a thickness of 2,000 Å was formed on the surplane of each ferroelectric thin film by sputtering, to thus produce a ferroelectric element. The withstand voltage characteristic of each ferroelectric element thus obtained was measured. The results are shown in FIG. 9. The ferroelectric element formed at 650° C. in the atmosphere of an oxygen concentration of 0.7% exhibits a leakage current density of $3.0 \times 10^{-9}$ A/cm$^2$ even at a voltage of 5 V, and therefore, it is superior in withstand voltage characteristic to the ferroelectric element formed at the conventional heat treatment temperature of 800° C. or 720° C.

Figure 5:
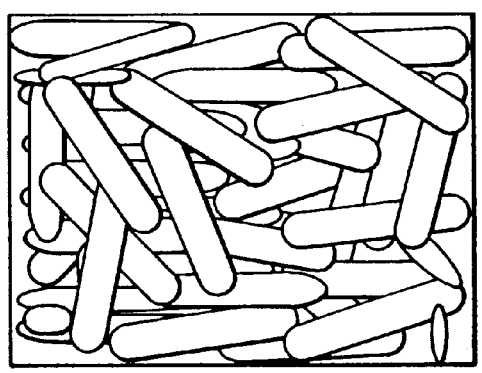
FIG. 5 is a schematic view showing a microstructure of the ferroelectric thin film of the present invention.

FIG. 5 is a schematic view of a micro-structure of the $SrBi_2Ta_2O_9$ ferroelectric substance obtained in this embodiment. From the micro-structure shown in FIG. 5, it becomes apparent that crystal grains of the ferroelectric thin film obtained in the atmosphere of a low oxygen concentration at a low temperature have an average grain size of about 70 nm or less, that is, the crystal grains are smaller and denser than those of the ferroelectric thin film obtained at a high temperature. Accordingly, the ferroelectric thin film obtained in this embodiment is small in leakage current density and good in withstand voltage characteristic.

Further, as a result of measuring the withstand voltage of the $(Ba_{0.5}Sr_{0.5})TiO_3$ high dielectric thin film formed in the third embodiment, the leakage current density was $5.0 \times 10^{-7}$ A/cm$^2$. Accordingly, it was confirmed that the above ferroelectric thin film had a good withstand voltage characteristic.

(Eighth Embodiment)

Figure 6:
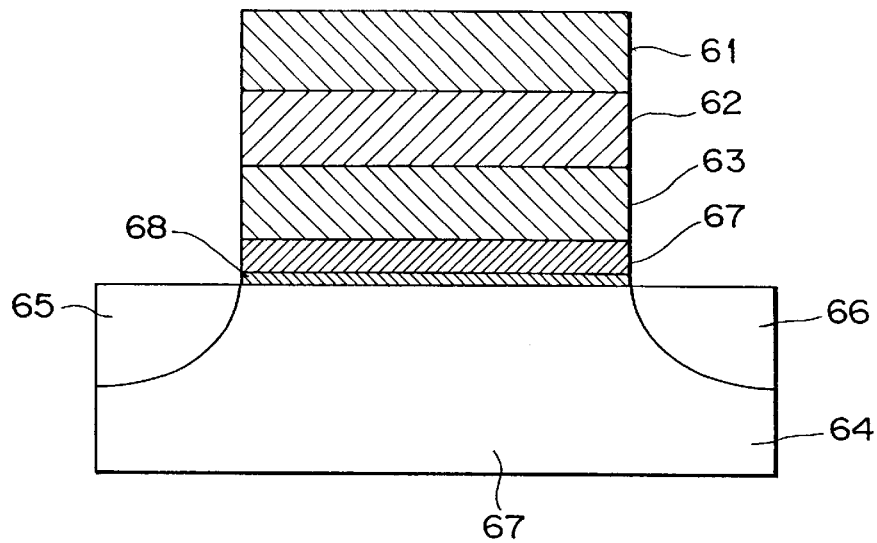
FIG. 6 is a sectional view showing a ferroelectric memory according to the present invention.

FIG. 6 is a sectional view of a ferroelectric memory using a ferroelectric element according to this embodiment. The ferroelectric memory has a structure including a MOS-transistor in which an oxide layer, a metal layer and an insulating layer are formed on a semiconductor field effect transistor structure, and a capacitor composed of the above ferroelectric element shown in FIG. 2. The production method will be described below. First, the surplane of an Si substrate 64 having a source region 65 and a drain region 66 was oxidized to form an $SiO_2$ film having a thickness of 260 Å. The $SiO_2$ film was mask-patterned to form an $SiO^2$ film 68 at a central portion of the substrate. A polycrystal Si film 67 having a thickness of 4,500 Å was formed on the projecting Si film 68 by CVD. The ferroelectric element having a structure including the top electrode 61, ferroelectric thin film, and low electrode 63 produced in the first embodiment was formed on the polycrystal Si film 67. In this way, a ferroelectric memory using the ferroelectric element was obtained. This ferroelectric memory is advantageous in that a difference in capacitance caused by reversal of an electric field can be detected at double the magnitude.

(Ninth Embodiment)

Figure 7:
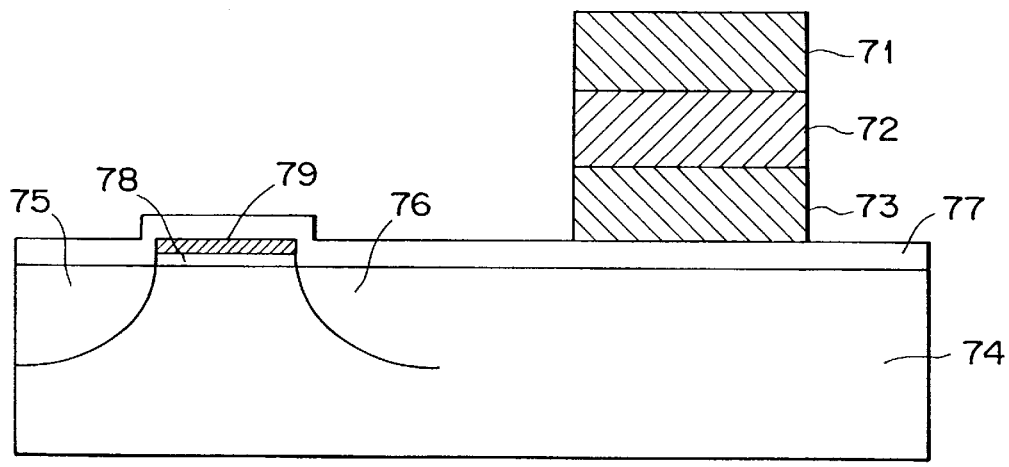
FIG. 7 is a sectional view showing a high dielectric memory according to the present invention.

FIG. 7 is a sectional view showing a high dielectric memory using a high dielectric element according to this embodiment. The production method will be described below. First, the surplane of an Si substrate 74 having a source region 75 and a drain region 76 was oxidized to form an SiO$_2$ film having a thickness of 270 Å. The SiO$_2$ film was mask-patterned to form a projecting SiO$_2$ film 78 at a central portion of the substrate. A polycrystal Si film 79 having a thickness of 4,600 Å was formed on the projecting Si film 78 by CVD, and then, the surplane of the Si substrate 74 was oxidized to form an SiO$_2$ film 77 having a thickness of 250 Å, thus producing a MOS transistor portion. The high dielectric element having the structure including the top electrode 71, high dielectric thin film 72 and bottom electrode 73 produced in the third embodiment was formed on a capacitor portion opposed to the semiconductor MOS portion thus obtained. In this way, a high dielectric memory using the high dielectric element was obtained. The high dielectric memory allows detection by a change in stored charge capacity obtained by a voltage of 3 V.

(Tenth Embodiment)

Figure 10A:
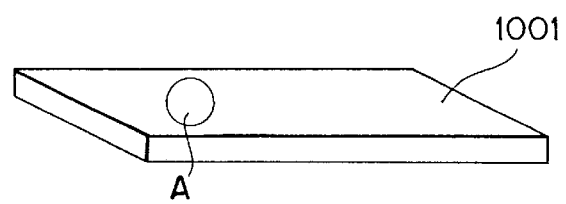
FIGS. 10($a$) and 10($b$) are views showing a non-contact type semiconductor device using the ferroelectric element of the present invention.
Figure 10B:
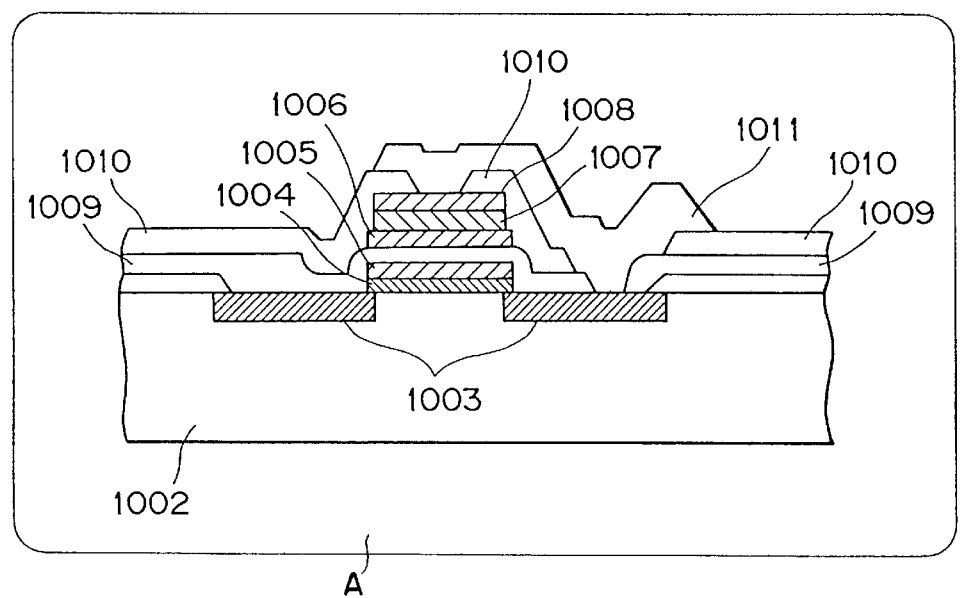

FIG. 10(*a*) shows a non-contact type semiconductor device 1001, and FIG. 10(*b*) shows the structure of a ferroelectric element A contained in the non-contact type semiconductor device. The ferroelectric element was formed as follows: namely, an SiO$_2$ gate film 1004 was formed on an Si substrate 1002 having a diffusion layer 1003, and was mask-patterned to form a gate electrode 1005. A ferroelectric capacitor includes a Pt bottom electrode 1006, an (SrBi$_2$Ta$_2$O$_9$) ferroelectric thin film 1007 formed at a low oxygen concentration, and a Pt top electrode 1008. To separate the transistor from the capacitor, SiO2 insulating layers 1009 and 1010 were formed, and the top electrode 1008 was connected to the diffusion layer 1003 via an aluminum interconnection 1011. A system using a non-contact semiconductor device includes a controller, a responsor containing a memory and a communication device, and an IC card containing the non-contact type semiconductor device, wherein a signal from the controller is transmitted to the IC card, and information necessary for the IC card is fed back to the controller on the basis of a command. The use of a non-volatile RAM for a memory element allows the reversal time of the ferroelectric substance to be one nanosecond or shorter. As a result, the system has various good performances in that an information reading operation is performed at an equidistance with an information writing operation, the transmission speed of data is high, and the rate of occurrence of an error upon writing is extremely reduced.

In the above embodiment, by way of example, a ferroelectric element having the Pt top electrode 1008, SrBi$_2$Ta$_2$O$_9$ ferroelectric thin film 1007, and bottom electrode 1006 has been described; however, a high dielectric element having an top electrode, a high dielectric thin film, and a bottom electrode may be provided. A semiconductor device using a high dielectric element has a 30 fF stored charge capacity at a voltage of 3 V.

As described above, the use of the ferroelectric element in this embodiment can provide a non-contact type semiconductor having good electrical characteristics.

As described above, since the liquid phase due to decomposition of oxides in the components is produced and the rate of crystal growth which originates from the liquid phase is increased when the oxide ferroelectric thin film and the oxide high dielectric thin film are formed in the atmosphere of the reduced concentration of oxygen, it is possible to form the oxide ferroelectric thin film and the oxide high dielectric thin film at temperatures lower than conventional, particularly, 650° C. or less and 600° C. or less, respectively, and further, to shorten the heat treatment time required for forming the thin film. As a result, in the thin film formed according to the present invention, the crystal structure is preferentially oriented at the crystal plane allowing the polarization axis to be directed in the vertical direction; the average crystal grain size is controlled at an optimum value; and reaction with the electrode is prevented. This makes it possible to form an oxide dielectric element having a high dielectric constant, the high spontaneous polarization, and a small coercive field. A ferroelectric memory for detecting reading and writing operations can be produced by incorporating the above ferroelectric element in the semiconductor field effect transistor, and a high dielectric memory for detecting reading and writing operations can be also produced by incorporating the above high dielectric element in the semiconductor MOS structure. Further, a semiconductor device using the ferroelectric memory or high dielectric memory as the non-contact type reading or writing memory can be produced.

In this way, the present invention is effective for application to a highly integrated ferroelectric element and high dielectric element, and a semiconductor device using such an element.

What is claimed is:

1. A method of producing an oxide dielectric element including a top electrode, an oxide dielectric thin film, and a bottom electrode, comprising the steps of:

forming said oxide dielectric thin film in an atmosphere containing oxygen at a concentration of more than 0.1% and less than 5% and at a temperature of 650° C. or less; and reheating said oxide dielectric thin film in an activated oxygen atmosphere.

2. A method of producing an oxide dielectric element including a top electrode, an oxide dielectric thin film, and a bottom electrode, comprising the steps of:

forming said oxide dielectric thin film in an atmosphere containing oxygen at a concentration of more than 0.1% and less than 5% and at a temperature of 600° C. or less; and reheating said oxide dielectric thin film in an activated oxygen atmosphere.

3. A method of producing an oxide dielectric element according to claim 1 or claim 2, wherein said oxide dielectric thin film is expressed by a composition of (Ba/Sr)TiO$_3$.

4. A method of producing an oxide dielectric element according to claim 1 or claim 2, wherein said oxide dielectric thin film is formed by a sputtering process, a Pulsed Laser deposition process or a MOCVD (Metal Organic Chemical Vapor Deposition) process, which is performed in an atmosphere of mixed gas of oxygen and inert gas.

5. A method of producing an oxide dielectric element according to claim 1 or claim 2, wherein said oxide dielectric thin film is formed by a spin-coating process or a dip-coating process using metal alkoxide or organic acid salt as a starting material, said process being performed in an atmosphere of a mixed gas of oxygen and an inert gas at atmospheric pressure.

6. A method of producing an oxide dielectric element according to claim 1 or claim 2, wherein said oxide dielectric thin film is re-heated by a sputtering process, a laser vapor-deposition process or a MOCVD process, which is performed in an ECR oxygen plasma.

7. A method of producing an oxide dielectric element according to claim 1 or claim 2, wherein the re-heating treatment is performed by a spin-coating process or a dip-coating process using metal alkoxide or organic acid salt as a starting material by irradiation with light in an ultraviolet region.

8. A method of producing an oxide dielectric element including a top electrode, an oxide dielectric thin film, and a bottom electrode, wherein:

said oxide dielectric thin film has a composition expressed by a chemical structural formula $(Pb/A)(Zr/Ti)O_3$, where A is one element selected from a group consisting of La, Ba and Nb; and the leakage current density of said oxide dielectric thin film is $10^{-6}$ A/cm$^2$ or less at a voltage of 5 V or less, and wherein the method includes the step of forming the oxide dielectric thin film at a temperature of 550° C. or less.

9. A method of producing an oxide dielectric thin film including a top electrode, an oxide dielectric thin film, and a bottom electrode, characterized in that said oxide dielectric thin film is expressed by a chemical structural formula: $(AO)^{2+}(BCO)^{2-}$, where A is one element selected from a group consisting of Bi, Ti, Hg, Pb, Sb and As; B is at least one element selected from a group consisting of Pb, Ca, Sr, Ba and rare earth elements; and C is at least one element selected from a group consisting of Ti, Nb, Ta, W, Mo, Fe, Co and Cr; and comprising the step of:

forming said oxide dielectric thin film in an atmosphere containing oxygen at a concentration of more than 0.1% and less than 5% and at a temperature of 650° C. or less.

10. A method of producing an oxide dielectric element including a top electrode, an oxide dielectric thin film, and a bottom electrode, comprising the step of:

forming said oxide dielectric thin film in an atmosphere containing oxygen at a concentration of more than 0.1% and less than 5% and at a temperature of 650° C. or less, wherein said oxide dielectric thin film is formed by a sputtering process, a Pulsed Laser deposition process or a MOCVD (Metal Organic Chemical Vapor Deposition) process, which is performed in an atmosphere of mixed gas of oxygen and inert gas.

11. A method of producing an oxide dielectric element including a top electrode, an oxide dielectric thin film, and a bottom electrode, comprising the step of:

forming said oxide dielectric thin film in an atmosphere containing oxygen at a concentration of more than 0.1% and less than 5% and at a temperature of 600° C. or less, wherein said oxide dielectric thin film is formed by a sputtering process, a Pulsed Laser deposition process or a MOCVD (Metal Organic Chemical Vapor Deposition) process, which is performed in an atmosphere of mixed gas of oxygen and inert gas.

* * * * *